United States Patent [19]

Chennakeshu et al.

[11] Patent Number: 5,249,205
[45] Date of Patent: Sep. 28, 1993

[54] ORDER RECURSIVE LATTICE DECISION FEEDBACK EQUALIZATION FOR DIGITAL CELLULAR RADIO

[75] Inventors: Sandeep Chennakeshu, Clifton Park; Anand Narasimhan, Troy; John B. Anderson, Latham, all of N.Y.

[73] Assignee: General Electric Company, Schenectady, N.Y.

[21] Appl. No.: 753,579

[22] Filed: Sep. 3, 1991

[51] Int. Cl.$^5$ .................. H04B 1/10; H03K 5/159
[52] U.S. Cl. ..................... 375/101; 375/13; 375/14; 375/16; 364/724.05; 364/724,15; 364/724.17; 364/724.2
[58] Field of Search .................. 375/11, 13, 14, 16, 375/96, 101, 103; 364/724.05, 724.15, 724.2, 724.17

[56] References Cited

U.S. PATENT DOCUMENTS

| | | | |
|---|---|---|---|
| 4,550,415 | 10/1985 | Debus, Jr., et al. | 364/724.2 |
| 4,635,276 | 1/1987 | Karabinis | 375/14 |
| 4,730,343 | 3/1988 | Kanemasa et al. | 375/103 |
| 5,050,186 | 9/1991 | Gurcan et al. | 375/14 |
| 5,063,573 | 11/1991 | Langewellpott | 375/96 |
| 5,157,690 | 10/1992 | Buttle | 375/101 |

OTHER PUBLICATIONS

"Adaptive Equalization in TDMA Mobile Radio Systems", R. D'Avella et al., 36th IEEE Vehicular Technology Conference, Tampa, Fla., pp. 385-392.
"A Generalized Multichannel Least Squares Lattice Algorithm Based on Sequential Processing Stages", F. Ling, et al., IEEE Transactions on Acoustics, Speech and Signal Processing., vol. ASSP-32, No. 2, Apr. 1984, pp. 381-389.
"An Adaptive MLSE Receiver for TDMA Digital Mobile Radio", R. D'Avella, et al., IEEE Journal on Selected Areas in Communications, vol. 7, No. 1, Jan. 1989, pp. 122-129.
"Adaptive Lattice Decision-Feedback Equalizers--Their Performance and Application to Time-Variant Multipath Channels", F. Ling et al., IEEE Transactions on Communications, vol. COM-33, No. 4, pp. 348-356.
"Bit Synchronization and Timing Sensitivity in Adaptive Viterbi Equalizers for Narrowband-TDMA Digital Mobile Systems", A. Baier et al., IEEE Vehicular Technology Conference, Philadelphia, Pa., pp. 377-384.
"Application of Fast Kalman Estimation to Adaptive Equalization", D. Falconer et al., IEEE Transactions on Communications, vol. COM-26, No. 10, Oct., 1978, pp. 1439-1446.
"Adaptive Maximum-Likelihood Receiver for Carrier-Modulated Data-Transmission Systems", G. Ungerboeck, IEEE Transactions on Communications, vol. COM-22, No. 5, May 1974, pp. 624-636.
"Results of Fast-Kalman and Viterbi Adaptive Equalizers for Mobile Radio with CEPT/GSM System Characteristics", Proc. of IEEE Globecom., pp. 26.3.1-26.3.5, 1988.
"Design and Performance of Synchronization Techniques and Viterbi Adaptive Equalizers for Narrowband TDMA Mobile Radio", G. D'Aria et al., 3rd Nordic Seminar on Digital Land Mobile Radio Comm., Copenhagen, Denmark, Sep. 13-15, 1988.
A. Narashimhan et al., "An Adaptive Lattice Decision Feedback Equalizer for Digital Cellular Radio", IEEE Vehicular Technology Conference, May 1990.

*Primary Examiner*—Curtis Kuntz
*Assistant Examiner*—Young Tse
*Attorney, Agent, or Firm*—Marvin Snyder

[57] ABSTRACT

A received time division multiple access (TDMA) signal having a time slot comprised of a plurality of symbols including at least one sequence of synchronizing symbols and a plurality of data symbols is demodulated by adaptively filtering the received signal to minimize inter-symbol interference due to an effect of channel signal propagation delay. The adaptive filtering step is performed by processing the received signal with a multi-stage lattice decision feedback equalizer having $(M=N_1-N_2)$ stages followed by $(N_2-1)$ two-dimensional stages. A metric is next formed for each of the stages in accordance with a predetermined mathematical relationship between the output signals of each of two stages. A plurality of the formed metrics are next accumulated over a plurality of time slots. A number of stages are then recursively determined for the lattice decision feedback equalizer for use during the next time slot by comparing, to a threshold value, the difference between the values of two accumulated metrics.

20 Claims, 6 Drawing Sheets

ORDER RECURSIVE LATTICE DECISION FEEDBACK EQUALIZATION FOR DIGITAL CELLULAR RADIO

RELATED APPLICATIONS

This application is related to the following U.S. patent applications which are filed concurrently herewith and assigned to the present assignee:
H. Lester et al. Ser. No. 07/754,471, "Automatic Simulcast Alignment";
S. Chennakeshu et al. Ser. No. 07/754,105, "Decision Feedback Equalization for Digital Cellular Radio";
S. Chennakeshu et al. Ser. No. 07/753,578, "Adaptive MLSE-VA Receiver for Digital Cellular Radio"; and
R. Toy et al. Ser. No. 07/754,108, "Frame/Slot Synchronization for U.S. Digital Cellular TDMA Radio Telephone System".

FIELD OF THE INVENTION

This invention relates generally to telecommunication method and apparatus and, in particular, to a demodulator for a digital cellular radio receiver including an Order Recursive Lattice Decision Feedback Equalizer (L-DFE).

BACKGROUND OF THE INVENTION

A requirement for increased capacity in the U.S. cellular radio system has resulted in adoption of digital technology. The digital system employs Time Division. Multiple Access (TDMA) as a channel access method in conjunction with a digital modulation scheme. A proposed IS-54 standard for digital cellular radio specifies a particular frame and slot structure. Under this standard, three to six users share a common 30 KHz radio frequency (RF) channel. Each user transmits data in an assigned time slot which is part of a larger frame. The gross bit rate of data transmitted over the channel is 48.6 Kbits/sec. The transmitted digital data is first mapped onto Pi/4-shifted-Differentially Encoded Quadrature Phase Shift Keying (DQPSK) symbols and then pulse shaped using a square root raised cosine filter. The pulse shaped signal is subsequently modulated onto an RF carrier.

Data transmission in this digital cellular system is adversely affected by multipath propagation which causes delay spread, and consequent Inter-Symbol Interference (ISI), where a symbol is comprised of a pair of binary bits. Delay spread is expressed in terms of a quantity called delay interval which is measured as the time interval between the first ray and last significant ray arriving at the receiver. Delay spreads exceeding one third of the symbol duration cause a significant increase in Bit Error Rate (BER), necessitating use of an equalizer in the receiver. Typical delay spreads encountered in urban and rural areas in the U.S. are less than 40 microseconds, implying a need for equalization of one symbol of interference (40 microseconds)for a data rate of 48.6 Kbits/sec. Mobile receivers also experience rapid channel variations and Doppler induced frequency shifts that are proportional to vehicle speed.

The channel impairments described above require that nonlinear adaptive equalizers be incorporated in cellular radios. Two suitable equalizers are the Decision Feedback Equalizer (DFE) and an equalizer based on Maximum Likelihood Sequence Estimation (MLSE). The MLSE method employs the well known Viterbi algorithm and is referred to in the art as a Viterbi Equalizer or an MLSE-VA equalizer.

Both the MLSE and DFE techniques have been researched in some detail for use in the European CEPT/GSM cellular radio system. Results of this research are reported by, for example, R. D'Avella et al., "An Adaptive MLSE Receiver for TDMA Digital Mobile Radio", IEEE Journal on Selected Areas in Communications, Vol. 7, No. 1, pp. 122-129, January 1989, G. D'Aria et al., "Design and Performance of Synchronization Techniques and Viterbi Adaptive Equalizers for Narrowband TDMA Mobile Radio", proceedings of 3rd Nordic Seminar on Digital Land Mobile Radio Comm., Copenhagen, Denmark, September 13-15, and A. Baier et al., "Bit Synchronization and Timing Sensitivity in Adaptive Viterbi Equalizers for Narrowband TDMA Digital Mobile Radio Systems", proceedings of IEEE Vehicular Technology Conference, Philadelphia, pp. 372-382, 1988. The following two references also relate to DFE for the CEPT/GSM system: G. D'Aria et al., "Adaptive Baseband Equalizers for Narrowband TDMA/FDMA Mobile Radio", CSELT Technical Report, Vol. 16, No. 1, pp. 19-27, February 1988; and G. D'Aria et al., "Results on Fast-Kalman Estimation to Adaptive Equalizers for Mobile Radio with CEPT/GSM System Characteristics", Proc. of IEEE Globecom, pp. 26.3.1-26.3.5, 1988.

The CEPT/GSM system is quite different from the system proposed for use in the U.S. in that it employs a narrower time slot, partial response modulation Gaussian Minimum Shift Keying (GMSK), a wider bandwidth (200 KHz) and a higher data rate (270.8 Kbits/sec.). The narrower time slot typically permits the channel to be treated as being time invariant, the wider bandwidth implies a reduced fade depth and the higher data rate results in increased ISI. As a result, the receiver equalization requirements of the European and the proposed U.S. cellular systems are different.

An MLSE-VA equalizer for use with the proposed US digital cellular system is disclosed by the present inventors S. Chennakeshu, A. Narasimhan and J. B. Anderson in copending and commonly assigned U.S patent application Ser. No. 07/753,578, filed Sept. 3, 1991 entitled "Adaptive MSLE-VA Receiver for Digital Cellular Radio". This MLSE-VA technique is based on the approach described by G. Ungerboeck in "Adaptive Maximum Likelihood Receiver for Carrier Modulated Data Transmission Systems", IEEE Trans. Comm., Vol. COM-22, No. 5, pp. 624-636, May 1974, which is incorporated herein by reference. The novel modifications made to this receiver, to render it operational in the mobile channel, include: splitting the front-end matched filter into (a) a fixed transversal filter that is matched to the transmitted signal pulse shape and (b) into an adaptive transversal filter that uses a complex fast Kalman algorithm to obtain an initial estimate of the channel. The adaptive transversal filter employs a normalized least mean square (NLMS) algorithm for signal element updates and for relating an adaptation rate to the decision depth of the Viterbi algorithm. The complex Fast Kalman Algorithm described therein is an extension of the type taught by D. Falconer et al. in "Application of Fast Kalman Estimation to Adaptive Equalization", IEEE Trans. Comm. Vol. Com-26, No. 10, pp. 1439-1446, October 1978, which is incorporated herein by reference. The novel extensions made to Falconer's technique provide for use with complex input data and without requiring matrix inversions.

Another MLSE demodulation approach, incorporated herein by reference, is described by G. D. Forney in "Maximum Likelihood Sequence Estimation of Digital Sequences in the Presence of Intersymbol Interference", IEEE Trans. Info. Theory, Vol. IT-18, pp. 363-378, May 1972. Forney's approach uses the Viterbi algorithm with a squared metric that is based on an assumption that the additive noise in the receive signal, at the input to the maximum likelihood sequence estimator, is white and Gaussian. This is accomplished through use of a whitening filter at the input of the maximum likelihood sequence estimator.

Another equalization technique employs an equalizer based on an adaptive, fractionally spaced DFE and is disclosed by the present inventors S. Chennakeshu, A. Narasimhan and J. B. Anderson in copending and commonly assigned U.S. patent application Ser. No. 07/754,105, filed Sept. 3, 1981, entitled "Decision Feedback Equalization For Digital Cellular Radio".

Another equalization technique is based on an adaptive Lattice DFE (L-DFE). By example, in articles entitled "Adaptive Lattice Decision-Feedback Equalizers-Their Performance and Application to Time-Variant Multipath Channels", IEEE Trans. Comm. Vol. COM-33, No. 4, pp. 348-356, April 1985 and "A Generalized Multichannel Least Squares Lattice Algorithm Based on Sequential Processing Stages", IEEE Trans. Acoust., Speech, Signal Processing, Vol. ASSP-32, No. 2, pp. 381-389, April 1984, Fuyun Ling and John G. Proakis describe a Least Squares L-DFE and a gradient L-DFE. Advantages of L-DFEs are said to include numerical stability, computational efficiency, a flexibility in changing a length of the equalizer and an excellent capability for tracking rapidly time-variant channels. These two Ling and Proakis articles are incorporated herein by reference.

It is thus an object of the invention to provide an improved DFE receiver for a digital cellular radio system.

Another object of the invention to provide an Order Recursive L-DFE receiver for a digital cellular radio system that is suitable for use with the proposed U.S. cellular radio signal standard.

A further object of the invention to provide a receiver for a digital cellular radio system that operates in accordance with an improved Order Recursive L-DFE and that employs an adaptive technique for continuously determining an order of the L-DFE.

SUMMARY OF THE INVENTION

The foregoing problems are overcome and the objects of the invention are realized by method and apparatus providing a demodulator for a digital cellular radio receiver that includes an order recursive lattice DFE.

More specifically, the invention contemplates a method and apparatus for demodulating a Time Division Multiple Access (TDMA) signal having a time slot comprised of a plurality of symbols. The time slot includes at least one sequence of synchronizing symbols and a plurality of data symbols. The method includes a first step of receiving the signal over a channel. In a second step, the received signal is adaptively filtered to minimize inter-symbol interference resulting from signal propagation delay through the channel. The step of adaptively filtering is accomplished by processing the received signal with a multi-stage lattice decision feedback equalizer having $(M=N_1-N_2)$ scalar stages followed by $(N_2-2)$ two-dimensional stages, forming a metric for each of the stages in accordance with a predetermined mathematical relationship between the stage output signal and another stage output signal, accumulating a plurality of the formed metrics over a plurality of time slots, and recursively determining a number of stages for the lattice decision feedback equalizer for use during a next time slot by comparing the difference between the values of two accumulated metrics to a threshold value. The metric is formed in accordance with the square of the difference between the output signals of consecutive stages. The threshold value is a function of the delay spread of the received signal and the signal to noise ratio.

BRIEF DESCRIPTION OF THE DRAWING

The features of the invention believed to be novel are set forth with particularity in the appended claims. The invention itself, however, both as to organization and method of operation, together with further objects and advantages thereof, may best be understood by reference to the following description taken in conjunction with the accompanying drawing(s) in which:

DETAILED DESCRIPTION OF THE INVENTION

Figure 1:
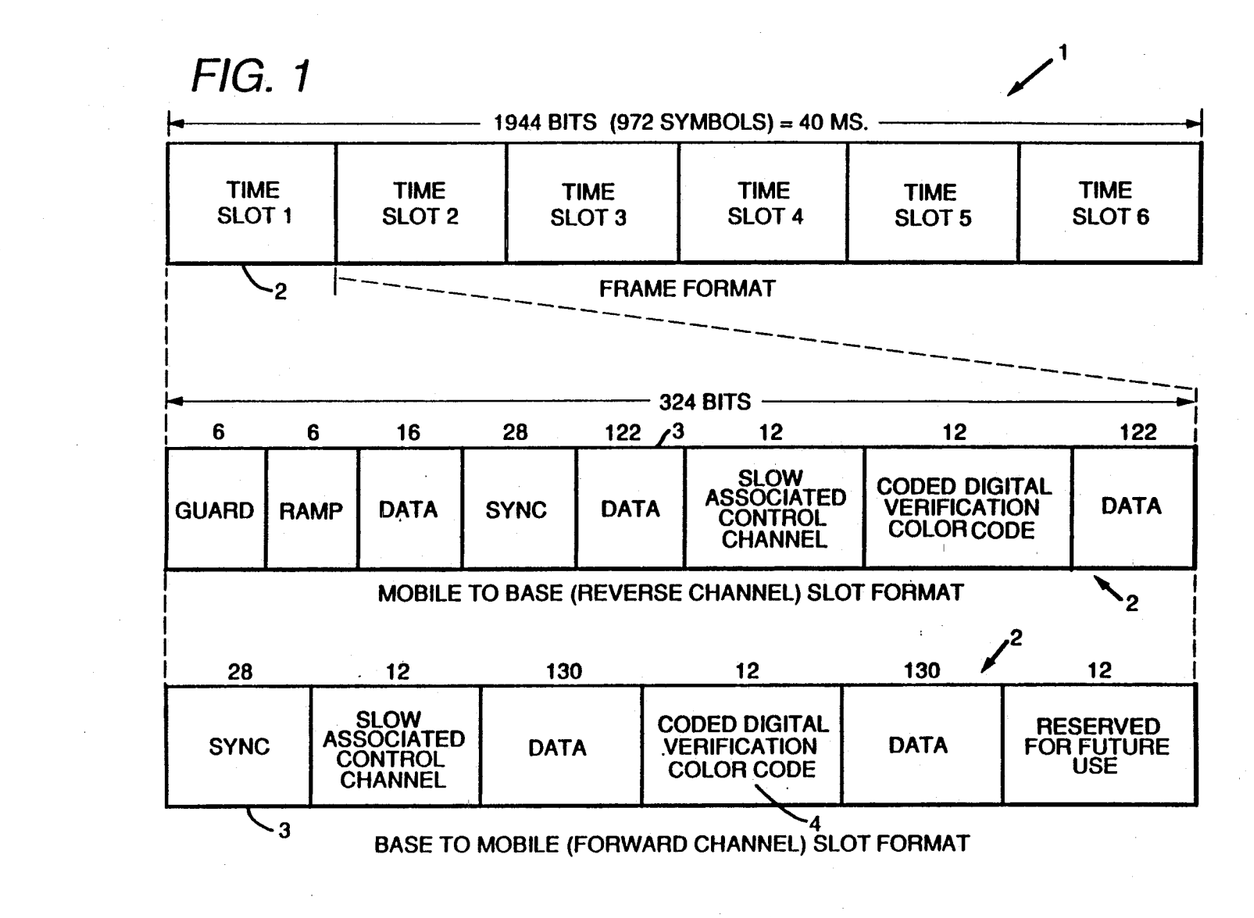
FIG. 1 illustrates the proposed IS-54 TDMA frame and slot structure.

The proposed IS-54 standard for digital cellular radio specifies a frame and slot structure as illustrated in FIG. 1. Under this standard, three to six users share a common 30 KHz RF channel. Each user transmits or receives data in an assigned time slot 2 of 324 bits duration within a larger (six slot) frame 1 of 40 milliseconds duration. The gross bit rate of data transmitted over the channel is 48.6 Kbits/sec.

Figure 2:
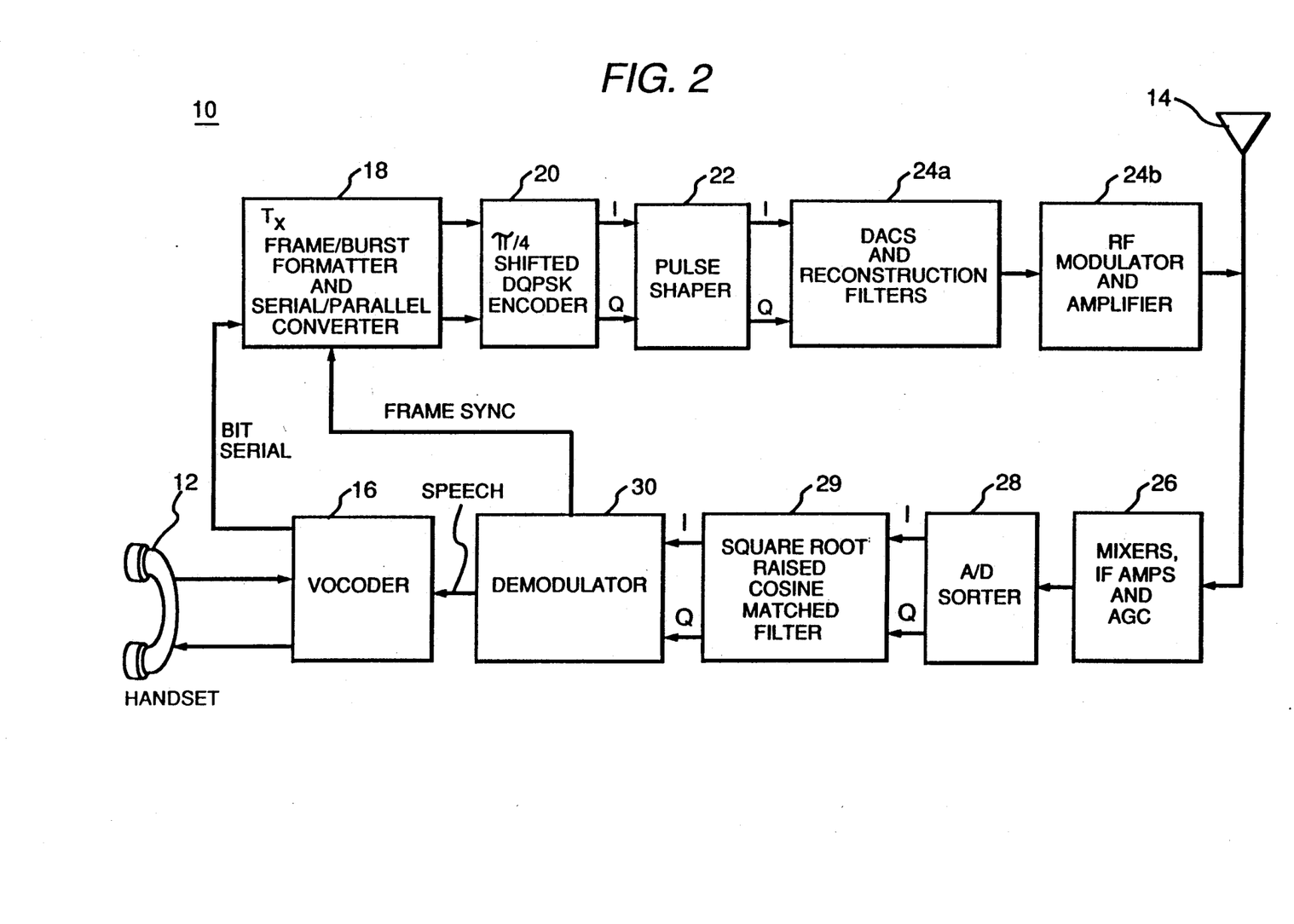
FIG. 2 is a simplified block diagram of a digital cellular radio telephone system that is constructed and operated in accordance with the invention.

FIG. 2 is a block diagram of a digital cellular radio system 10 incorporating the invention. System 10 includes a transmitter section and a receiver section. A handset 12 inputs and outputs audio information and an antenna 14 transmits an 824-849 MHz modulated RF carrier signal and receives an 869-894 MHz modulated RF signal. Each RF signal is transmitted in a channel having a bandwidth equal to 30 KHz. The system 10 may be installed within a motor vehicle and function as a mobile telephone. Alternatively, system 10 may be constructed for use as a hand held or portable radio unit that can be carried by a user (e.g., in a back-pack). A base station system may also be constructed of apparatus substantially as shown.

A vocoder 16 coupled to handset 12 includes an analog-to-digital (A/D) converter (not shown) for converting audio signals from the handset 12 microphone to a digital bit serial pulse stream. Output bits from vocoder 16 are supplied to a transmitter (Tx) frame/burst formatter 18, wherein the digital data are formatted and converted to parallel form for application to a pi/4-Shifted-DQPSK encoder 20. In-phase (I) and quadrature (Q) component output signals of encoder 20 are applied to a Nyquist square root raised cosine pulse shaper 22. Formatter 18, encoder 20 and pulse shaper 22 function as a digital modulator. The pulse shaped I and Q output signals of shaper 22 are applied to analog signal reconstruction circuitry 24a that includes digital-to-analog (D/A) converters and reconstruction filters for converting the shaped I and Q input digital information to analog signals for modulating the RF carrier. The modulated RF carrier, produced by an RF modulator and amplifier 24b, is amplified and then transmitted from an antenna 14.

Vocoder 16 receives a digital pulse stream input from the receiver circuitry and includes a D/A converter (not shown) for converting this pulse stream to an analog speech signal for driving a handset 12 speaker. The receiver circuitry includes an RF and intermediate frequency (IF) stage 26 (hereinafter referred to as the IF filter) employing frequency mixers, IF amplifiers and an Automatic Gain Control (AGC) circuit. A high speed A/D converter circuit 28 includes, preferably, a flash A/D converter for converting the received signal to digital form, and a sorter for separating the converted signal into I and Q components which are supplied to a square root raised cosine filter 29 that is matched to the transmitter pulse shaper 22. Output signals of the matched filter 29 are fed to a baseband data demodulator 30. Demodulator 30 processes the I and Q received signals to extract the speech information that is input to the vocoder 16. Specific aspects of this process are described in detail below.

Another task of demodulator 30 is to process the incoming bit stream to achieve and maintain frame/slot synchronization. This function is preferably accomplished in accordance with the method and apparatus described in copending and commonly assigned patent application Ser. No. 07/754,108, filed Sep. 3, 1991 by Chennakeshu and R. Toy, entitled "Frame/Slot Synchronization For U.S. Digital Cellular Radio Telephone System". The frame/slot information is also provided to frame/burst formatter 18 for use in synchronizing the transmitted information with the frame/slot timing.

Figure 3:
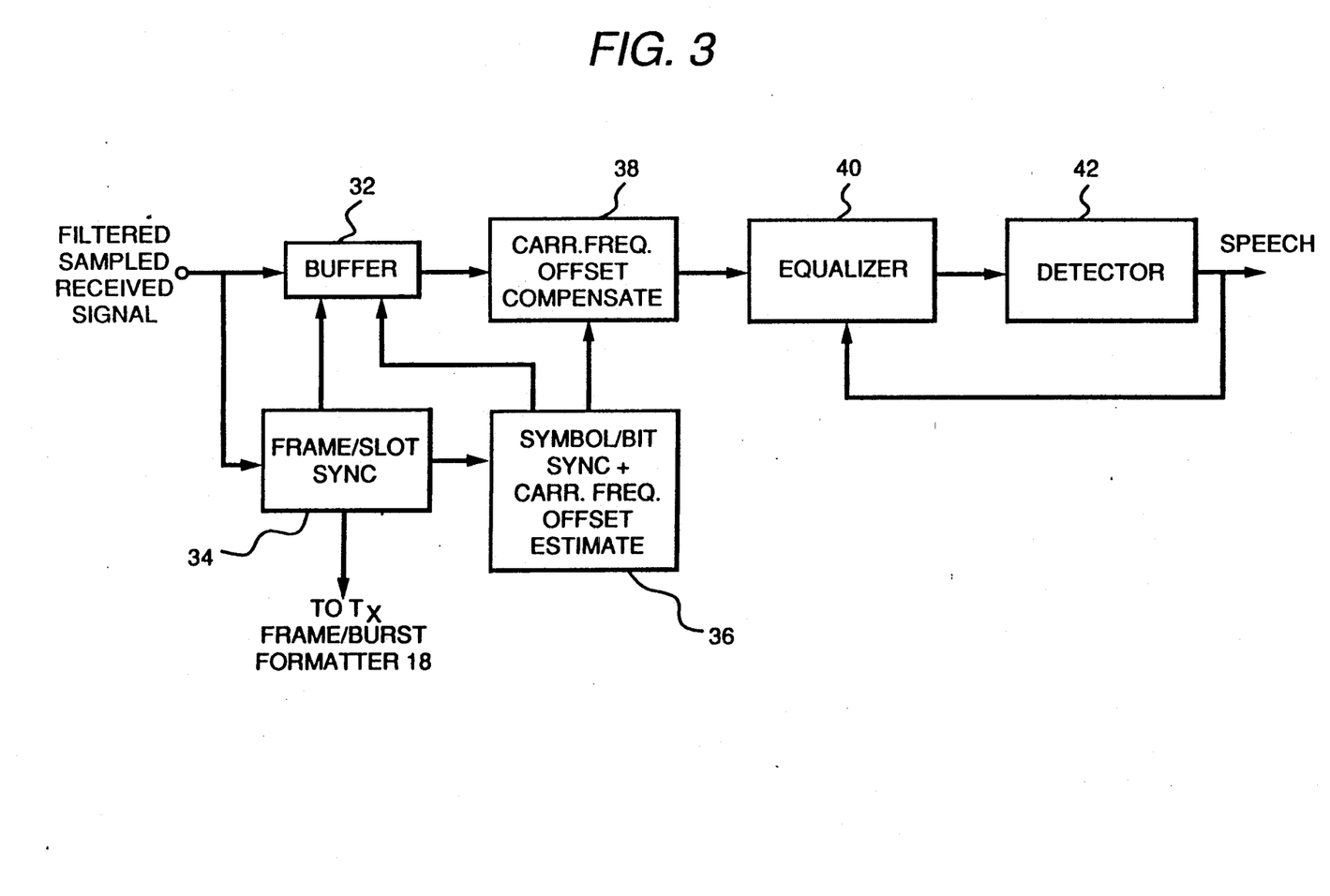
FIG. 3 is a block diagram that illustrates in greater detail the demodulator of FIG. 2.

As shown in greater detail in FIG. 3, demodulator 30 includes an input buffer 32 and a frame/slot synchronizer 34, each of which receives the I and Q digital data provided by the square root raised cosine filter following the A/Ds and sorter 28. The square root raised cosine filter (matched to the transmit filter) may be eliminated to reduce circuit complexity at the expense of performance degradation. It is also possible to include the square root raised cosine filter as part of the IF filter. Further components of demodulator 30 process the input data to perform carrier frequency error compensation (block 38), symbol timing adjustment (block 36), equalization (block 40) and detection (block 42).

System 10 of FIG. 2 may be implemented in any one of a number of suitable embodiments including discrete components, digital signal processors and combinations thereof. In a presently preferred embodiment of the invention, vocoder 16 and the digital modulator, including formatter 18, encoder 20 and pulse shaper 22, are each implemented with a digital signal processor of the type known as TMS320C25, while demodulator 30 is implemented with a digital signal processor of the type known as TMS320C30. The TMS320-type digital signal processors, including application and programming information, are available from Texas Instruments, Incorporated. The invention, however, is not to be construed as being limited to any one specific hardware or software embodiment.

Before describing in greater detail equalizer 40 of FIG. 2, used in conjunction with the Order Recursive L-DFE demodulator 30 embodiment of the invention, it is first noted that a number of simulation studies for mobile channel equalizers employ a multipath model that includes a number of discrete Rayleigh fading paths Such is the case for the articles mentioned previously R. D'Avella et al., "Adaptive Equalization in TDMA Mobile Radio Systems", 36th IEEE Vehicular Technology Conference, Tampa, Florida, pp. 385-392, 1987; R. D'Avella, et al., "An Adaptive MLSE Receiver for TDMA Digital Mobile Radio", IEEE Journal on Selected Areas in Communications, Vol. 7, No. 1, 122-129, January 1989; G. D'Aria et al., "Adaptive Baseband Equalizers for Narrowband TDMA/FDMA Mobile Radio", CSELT Technical Report, Vol. 16, No. 1, pp. 19-27, February 1988; and G. D'Aria et al., "Results on Fast-Kalman Estimation to Adaptive Equalizers for Mobile Radio with CEPT/GSM System Characteristics", Proc. of IEEE Globecom, pp. 26.3.1-26.3.5, 1988. A relatively simple two ray model has been found to be useful in modeling a frequency selective mobile channel and testing equalizer performance. For example, see also B. Glance et al., "Frequency-Selective Fading Effects in Digital Mobile Radio with Diversity Combining" IEEE Trans. Comm. Vol. COM-31 pp. 1085-1094, September 1983, which is incorporated herein by reference.

As such, the invention is presented below in the context of a two ray channel model wherein the rays are independently Rayleigh faded, have equal average power and are frequency shifted by a Doppler spread corresponding to the vehicle speed. In this two ray model the RMS delay corresponds to one half of the delay interval between the two rays.

Figure 4A:
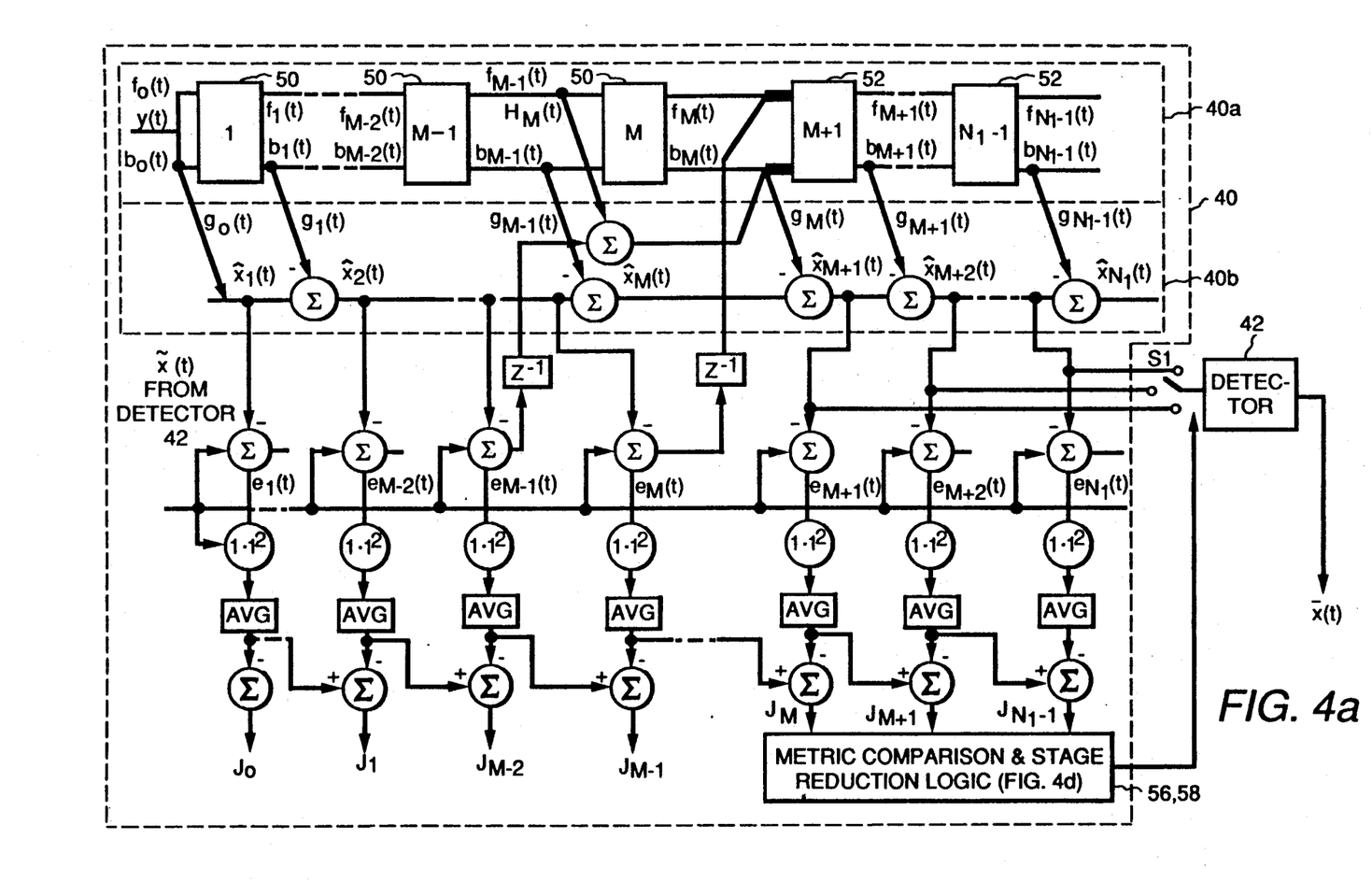
FIG. 4a is a block diagram illustrating the Order Recursive Lattice DFE embodiment of the invention.
Figure 4B:
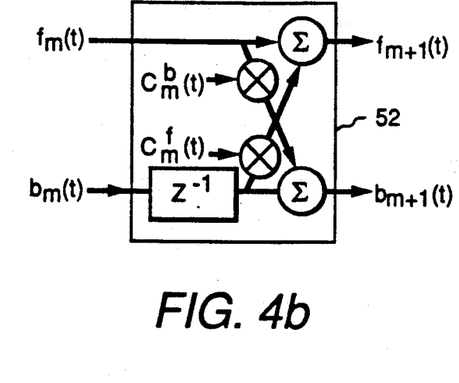
FIG. 4b is a block diagram illustrating a two channel stage.
Figure 4C:
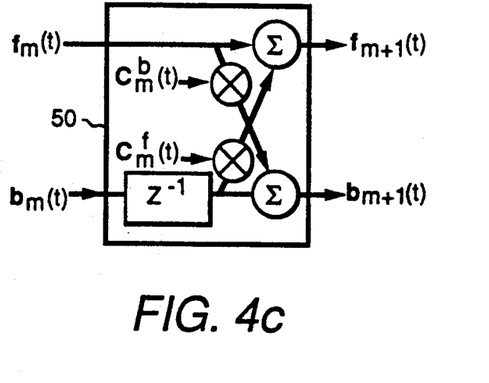
FIG. 4c is a block diagram illustrating a single channel scalar stage.

As illustrated in FIGS. 4a-4d an L-DFE 40 exploits the order recursive nature of the lattice structure to adaptively vary the number of filter stages (taps), as shown in FIG. 4c, thereby achieving a relatively uniform BER performance over a wide range of channel delay spreads. The order of the DFE is varied by using a time average of accumulated squared error differences between successive stages.

The L-DFE 40 is based on that described by F. Ling and J. G. Proakis in the two journal articles noted above insofar as the adaptation algorithm is concerned. However, the L-DFE of the invention is extended to make it order recursive through the addition of a stage reduction algorithm. L-DFE 40 includes a multichannel lattice predictor 40a portion and a joint estimator 40b portion. The lattice predictor 40a has $(M = N_1 - N_2)$ scalar stages 50 (FIG. 4c) followed by $(N_2 - 1)$ two-dimensional stages 52 (FIG. 4b). A first input signal to L-DFE 40 is the received signal y(t). A second input signal is the detected symbol $\tilde{X}(t)$ fed back from detector 42.

As indicated in FIG. 4a, the $f_0(t)$ and $b_0(t)$ input signals to scalar stages 50 (designated 1, M−1 and M, respectively) result in output signals designated $f_1(t)$ and $b_1(t)$, $f_{M-1}(t)$ and $b_{M-1}(t)$, and $f_M(t)$ and $b_M(t)$, respectively. Similarly, signals $f_M(t)$ and $b_M(t)$ are input signals to two-dimensional stages 52 (designated M+1 and $N_1-1$, respectively) which produce output signals designated $f_{M+1}(t)$ and $b_{M+1}(t)$, and $f_{N_1-1}(t)$ and $b_{N_1-1}(t)$, respectively. The subscript designations for these signals correspond to the designations of the two-dimensional stages.

In FIG. 4a, the term $g_i(t)$ represents a gain factor for the $b_i(t)$ output signal of the ith stage, with the subscript i designating the ith stage producing that signal (where $e_i = 0, 1, \ldots N_1 - 1$), while the symbol $Z^{-1}$ represents a unit delay, the symbol $\Sigma$ represents an algebraic adder circuit, and the term $e(t)$ where e has a subscript i corresponding to the ith stage which represents the error between $\tilde{x}(t) - \hat{x}_i(t)$ for that ith stage. The term $H_M(t)$ represents a gain factor for the output signal designated $f_{M-1}(t)$. The symbol $|\cdot|^2$ represents magnitude squared (for example, $|x|^2$). The designation AVG signifies an averaging circuit which time-averages the input signals supplied thereto while bold face symbol $\boldsymbol{\Sigma}$ signifies an averaging circuit which averages the difference of the input signals thereto.

In an L-DFE 40 training mode of operation an actual transmitted symbol $x(t)$ is used in place of $\tilde{X}(t)$. To recover the symbol $x(t)$, the L-DFE 40 employs a linear combination of the received signal $y(t)$, delayed samples $y(t-i)$ of the received signal, and previously-detected samples of $x(t)$, namely $\tilde{X}(t)$. A generalized derivation of this technique is found in the aforementioned article "A Generalized Multichannel Least Squares Lattice Algorithm Based on Sequential Processing Stages", IEEE Trans. Acoust., Speech, Signal Processing, Vol. ASSP-32, No. 2, pp. 381–389, April 1984, by F. Ling and J. G. Proakis. This technique is summarized below as an aid in understanding the operation of the L-DFE 40 of the invention. It is noted that boldface characters represent matrices or vectors. Specifically, $\mathbf{f}_m(t)$, $\mathbf{b}_m(t)$ and $\mathbf{k}^x(t)$ are 2×1 vectors, while $\mathbf{R}_m{}^f(t)$, $\mathbf{R}_m{}^b(t)$ and $\mathbf{k}_m(t)$ are 2×2 matrices. All other quantities are scalars. $\delta$ is chosen to be a very small positive number, while $\lambda$ is a positive number close to one (typically 0.95–1.0). Unless otherwise stated, all quantities take complex values. Symbols (*), (') and (H) denote complex conjugate, transpose and conjugate transpose respectively.

Initialization $b_0(t) = f_0(t) = y(t), k_M{}^b(0) = 0 \ (M = N_1 - N_2)$ $r_0{}^f(t) = r_0{}^b(t) = \lambda r_0{}^f(t-1) + |y(t)|^2$ $r_0{}^f(0) = 0, e_0(t) = \tilde{x}(t), \hat{x}_0(t) = 0$ $\alpha_m(t) = 1, K_m{}^x(0) = 0, r_m{}^f(0) = r_m{}^b(0) = \delta \ (m = 1, 2, \ldots, N_1 - N_2 - 1)$ $k_m(0) = k_m{}^x(0), k_m(0) = 0, k_m{}^x(0) = 0$ $\mathbf{R}_m{}^f(0) = \mathbf{R}_m{}^b(0) = \delta \mathbf{I} \ (m = N_1 - N_2, \ldots, N_1)$ where I denotes a 2×2 identify matrix.

Scalar Stages ($0, m \leq N_1 - N_2$) unless specified $$f_m(t) = f_{m-1}(t) - k_m{}^*(t-1) b_{m-1}(t-1)/r_{m-1}{}^b(t-2) \quad (1)$$

$$b_m(t) = b_{m-1}(t) - k_m(t-1) f_{m-1}(t-1)/r_{m-1}{}^f(t-1) \quad (2)$$

$$k_m(t) = \lambda k_m(t-1) + \alpha_{m-1}(t-1) f_{m-1}(t) b_{m-1}{}^*(t-1) \quad (3)$$

$$r_m{}^f(t) = r_{m-1}{}^f(t) - |k_m(t)|^2 / r_{m-1}{}^b(t-1) \quad 0 \leq m \leq N_1 - N_2 \quad (4)$$

$$r_m{}^b(t) = r_{m-1}{}^b(t-1) - |k_m(t)|^2 / r_{m-1}{}^b(t-1) \quad 0 \leq m \leq N_1 - N_2 \quad (5)$$

$$\hat{X}_m(t) = \hat{X}_{m-1}(t) + k_m{}^{x*}(t-1) b_{m-1}(t) / r_{m-1}{}^b(t-1) \quad 0 \leq m \leq N_1 - N_2 \quad (6)$$

$$\alpha_m(t) = \alpha_{m-1}(t) - |b_{m-1}(t) \alpha_{m-1}(t)|^2 / r_{m-1}{}^b(t) \quad (7)$$

$$e_m(t) = \tilde{X}(t) - \hat{X}_m(t) \quad 0 \leq m \leq N_1 - N_2 \quad (8)$$

$$k_m{}^x(t) = \lambda k_m{}^x(t-1) + \alpha_{m-1}(t) e_{m-1}{}^*(t) b_{m-1}(t) \quad (9)$$

Transitional Stage ($M = N_1 - N_2$)

$$\hat{b}_M(t) = e_{M-1}(t-1) - k_M{}^b(t-1) f_{M-1}(t)/r_{M-1}{}^f(t-1) \quad (10)$$

$$k_m{}^b(t) = \lambda k_m{}^b(t-1) + \alpha_{M-1}(t-1) f_{M-1}{}^*(t-1) e_{M-1}(t-1) \quad (11)$$

$$\mathbf{f}_M(t) = [f_M(t) \ e_M(t-1)]' \quad (12)$$

$$\mathbf{b}_M(t) = [b_M(t) \ \hat{b}_m(t)]' \quad (13)$$

$$\mathbf{R}_M{}^f(t) = \lambda \mathbf{R}_M{}^f(t-1) + \alpha_M(t-1) \mathbf{f}_M(t) \mathbf{f}_M{}^H(t) \quad (14)$$

$$\mathbf{R}_M{}^b(t) = \lambda \mathbf{R}_M{}^b(t-1) + \alpha_M(t) \mathbf{b}_M(t) \mathbf{b}_M{}^H(t) \quad (15)$$

Two-Dimensional Stages ($N_1 - N_2 < m < N_1$) unless specified $$\mathbf{f}_m(t) = \mathbf{f}_{m-1}(t) - \mathbf{k}_m{}^H(t-1) [\mathbf{R}_{m-1}{}^b(t-2)]^{-1} \mathbf{b}_{m-1}(t-1) \quad (16)$$

$$\mathbf{b}_m(t) = \mathbf{b}_{m-1}(t) - \mathbf{k}_m(t-1) [\mathbf{R}_{m-1}{}^f(t-1)]^{-1} \mathbf{f}_{m-1}(t) \quad (17)$$

$$\mathbf{k}_m(t) = \lambda \mathbf{k}_m(t-1) + \alpha_{m-1}(t-1) \mathbf{b}_{m-1}(t-1) \mathbf{f}_{m-1}{}^H(t) \quad (18)$$

$$\mathbf{R}_m{}^f(t) = \lambda \mathbf{R}_m{}^f(t-1) + \alpha_m(t-1) \mathbf{f}_m(t) \mathbf{f}_m{}^H(t) \quad (19)$$

$$\mathbf{R}_m{}^b(t) = \lambda \mathbf{R}_m{}^b(t-1) + \alpha_m(t) \mathbf{b}_m(t) \mathbf{b}_m{}^H(t) \quad (20)$$

$$\alpha_m(t) = \alpha_{m-1}(t) + \alpha_{m-1}{}^2(t) \mathbf{b}_{m-1}{}^H(t) [\mathbf{R}_{m-1}{}^b(t)]^{-1} \mathbf{b}_{m-1}(t) \quad (21)$$

$$\hat{X}_m(t) = \hat{X}_{m-1}(t) + \mathbf{k}_m{}^{xH}(t-1) [\mathbf{R}_{m-1}{}^b(t-1)]^{-1} \mathbf{b}_{m-1}(t) \ (N_1 - N_2 \leq m \leq N_1) \quad (22)$$

$$e_m(t) = \tilde{x}(t) - \hat{X}_m(t) \quad (23)$$

$$\mathbf{k}_m{}^x(t) = \lambda \mathbf{k}_m{}^x(t-1) + \alpha_{m-1}(t) \mathbf{b}_{m-1}(t) e_{m-1}{}^*(t) \ (N_1 - N_2 \leq m \leq N_1) \quad (24)$$

The structure of the above set forth algorithm does not permit independent changes in the number of feedforward and feedback stages (taps). However, pairs of stages (i.e., two-dimensional stages) can be added or deleted as needed. The DFE structure may be visualized as follows. A 2-D stage comprises a 1-D stage superimposed upon another 1-D stage as if they operate in parallel but are interconnected. The feedback stages are the 1-D stages that are superimposed upon the existing 1-D stages (feed forward) to constitute the 2-D stage. As a result of this structure, if a stage is removed, only a 2-D stage (comprised of a feed forward stage and a feedback stage) is removed in order not to affect the remainder of the DFE structure.

In FIG. 4b, the gain terms $C_m{}^b(t)$ and $C_m{}^f(t)$ may be expressed as:

$$C_m^b(t) = - \frac{k_m^*(t-1)}{r_{m-1}^b(t-2)}$$

and $$C_m^f(t) = - \frac{k_m(t-1)}{r_m^f(t-1)}$$

while in FIG. 4c, the gain terms $C_m^b(t)$ and $C_m^f(t)$ may be expressed as:

$$C_m^b(t) = -k_m^{xH}(t-1) [R_{m-1}^b(t-2)]^{-1}$$

and $$C_m^f(t) = -k_m(t-1) [R_m^f(t-1)]^{-1}$$

In addition, $$H_m(t) = \frac{k_M^b(t-1)}{r_{M-1}^f(t)}$$

and $$g_{M-1}(t) = \frac{k_M^*(t-1)}{r_{M-1}^b(t-1)}.$$

For $m > N_1 - N_2$, $$H_m(t) = -k_m(t-1) [R_{m-1}^f(t)]^{-1}$$

and $$g_m(t) = -k_m^{xH}(t-1) [R_{m-1}^b(t-1)]^{-1}.$$

In accordance with an aspect of the invention, the number of filter stages to be used is determined by the metrics $J_0, J_1, J_2 \ldots, J_{N_1-1}$, which are each formed in FIG. 4a as a mean square of error differences between consecutive stages:

$$J_i = E[e_{i+1}(t)^2 - e_i(t)^2]_{i=0,1,\ldots,(N_1-1)} \quad (25)$$

The ensemble average denoted by E(.) may be replaced by a time average:

$$J_i = \frac{1}{N_{slt}} \sum_{j=1}^{N_{slt}} \{\overline{e}_{i+1}(j)^2 - \overline{e}_i(j)^2\} \quad (26)$$

where $N_{slt}$ denotes the number of time slots 1 (FIG. 1) over which the time average is taken and $\overline{e}_i(j)$ denotes the error (Equation 23) at stage i averaged over one time slot 2 of FIG. 1. Typically, the delay spread changes gradually and its effect is noticeable only over several time slots. As a result, the metrics $J_0, J_1, J_2 \ldots, J_{N_1-1}$ are accumulated over several time slots and the following decision rule is employed to make a decision regarding the appropriate number of filter stages (taps):

Number of stages = $n - 1$ if $$|J_{n-1} - J_n| < \epsilon_{th} \quad (27)$$

with $\epsilon_{th}$ is a predetermined threshold value.

More specifically, the threshold value $\epsilon_{th}$ was set to the value of the mean square error (MSE), approximately $3 \times 10^{-2}$ and was chosen based on experimentation. The mean square error depends on the signal-to-noise ratio (SNR) and, hence, requires the threshold $\epsilon_{th}$ to be adaptive. Because the control voltage of the AGC loop (block 26 of FIG. 2) provides an indication of the SNR, this control voltage can be used to set the value of the threshold.

The minimum number of slots over which the metric is accumulated depends on approximating the ensemble average with a time average. For example, a value of 30 slots may be used.

Stages are bypassed through switch $S_1$ (FIG. 4a) which disconnects the outputs of the unnecessary or unwanted stages from contributing to the detection process. The stages are dropped off sequentially from the end, rather than in a random manner.

In order to retain a DFE structure, at least one feedback stage must be retained, which implies at least one two-dimensional stage. Otherwise, with no two-dimensional stage, the filter would reduce to a scalar lattice filter. Hence, the minimum DFE size requires $N_1 - 2$ scalar stages and one two-dimensional stage.

In some instances, such as when the delay spread=0, the DFE will produce a higher bit error rate than if a conventional differential detector were used. In this situation, channel conditions may be monitored such that the DFE may be switched out and the differential detector used in its place. The channel can be monitored, for example, by using information from the speech coder. One example would be to monitor the CRC (cyclic redundancy check) sums of the speech coder 16 (FIG. 2) to determine the channel condition and to use this information to perform the switch between the DFE and the differential detector.

Figure 4D:
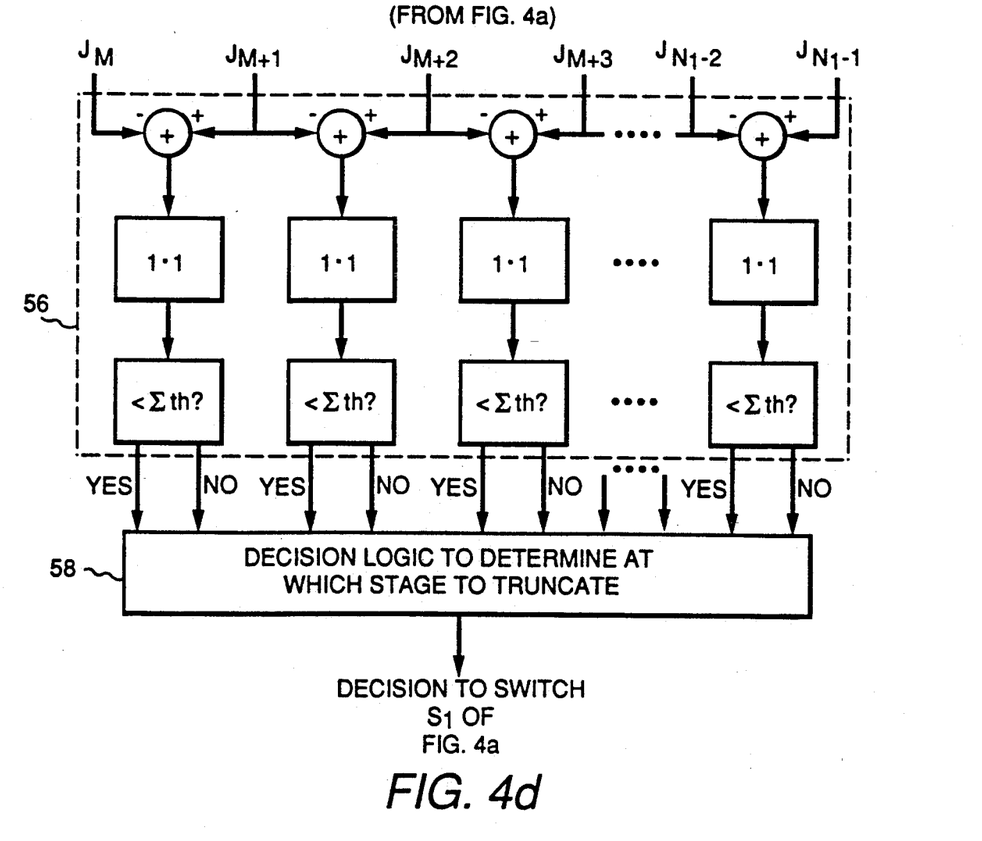
FIG. 4d is a block diagram of metric comparison logic and scalar stage reduction logic that forms a portion of the Order Recursive Lattice DFE.

The decision logic block 58 (FIGS. 4a,4d) that determines the stage at which the DFE is truncated may employ several different criteria. The simplest algorithm truncates at stage $n-1$ if:

$$|J_n - J_{n-1}| < \epsilon_{th}.$$

That is, truncate at the first stage whose differential metric $J_n - J_{n-1}|$ is determined to be less than the threshold. This comparison function is accomplished by the metric comparison logic 56 of FIG. 4d.

In some instances the metrics will be noisy and unreliable. In this case it may be desirable to "poll" all metric comparisons with the decision block 58 (FIGS. 4a,4d) before making a truncation decision. The decision as to which stages to remove is made so as to retain as many stages as possible without degrading the operation of the L-DFE 40 of FIG. 4a.

As an example, and assuming that $\epsilon_{th} = 4$:

| | | |
|---|---|---|
| $|J_{M+1} - J_M| = 4$ | $= \epsilon_{th}$ |
| $|J_{M+2} - J_{M+1}| = 2$ | $< \epsilon_{th}$ |
| $|J_{M+3} - J_{M+2}| = 5$ | $> \epsilon_{th}$ |
| $|J_{M+4} - J_{M+3}| = 3$ | $< \epsilon_{th}$ |
| $|J_{M+5} - J_{M+4}| = 2$ | $< \epsilon_{th}$ |
| $|J_{M+6} - J_{M+5}| = 1$ | $< \epsilon_{th}$ |

If the first truncation decision algorithm were employed, truncation would occur at stage $M+1$, corresponding to the comparison $|J_{M+2} - J_{M+1}| = 2$. However, by examining all of the comparisons, stage $M+3$ should be chosen instead so that a more reliable truncation would result. The decision where to truncate preferably is made to retain as many stages as possible to maintain performance. Truncation at stage $M+1$ would be considered, for this example, as a false alarm condition.

Several variants of the algorithm can be envisaged depending upon the robustness and complexity required. However, by averaging the metrics over 30 slots (see eqn. 26) a false alarm is rarely observed and the relatively simple scheme given by equation 26 is found to provide adequate performance.

The complexity of the L-DFE, in terms of a number of multiplications and additions required per iteration, can be compared to that of the DFE employing a Complex Fast Kalman Algorithm disclosed in commonly assigned U.S. patent application Ser. No. 07/753,578, filed Sep. 3, 1991, entitled "Adaptive MLSE-VA Receiver for Digital Cellular Radio" Generally, there is an increase in complexity with the use of the L-DFE. However, in that the most frequently encountered delay spread values are less than a symbol period, the effective size of the L-DFE 40 is small. This results in the complexity of the L-DFE being comparable to that of a fractionally spaced DFE, employing a Complex Fast Kalman Algorithm.

Symbol timing estimation involves determining a best sample, from the point of detection, in each symbol interval. Carrier frequency offset is manifested as a phase rotation of actual symbol phases. Estimation of carrier frequency offset corresponds to determining the phase rotation per symbol period. In accordance with a further aspect of the invention a sample timing and carrier frequency error estimation technique, operating in conjunction with the L-DFE 40 (FIGS. 3 and 4), is now described.

Figure 5:
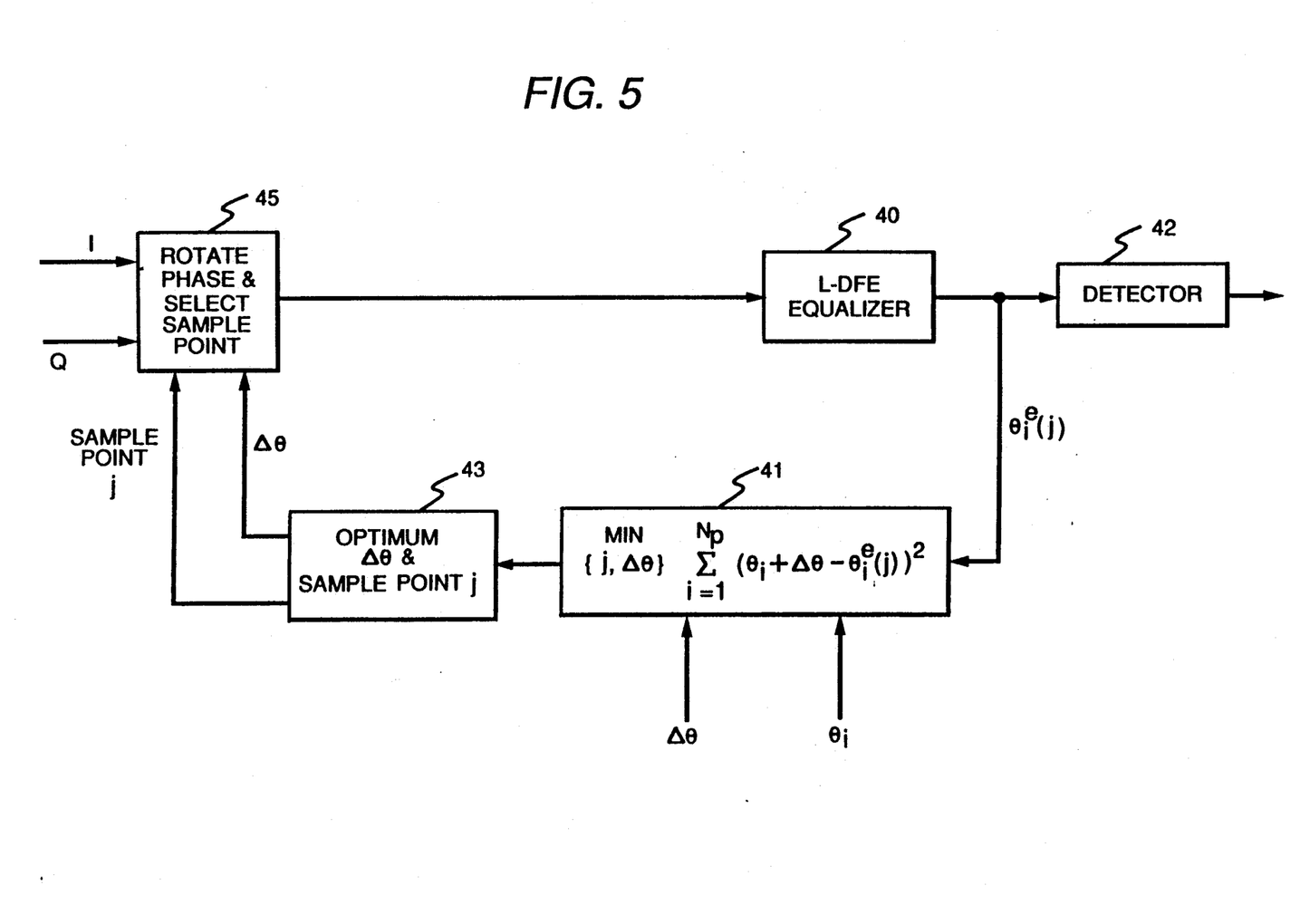
FIG. 5 is a block diagram illustrating a preferred technique for accomplishing symbol timing and carrier frequency offset recovery.

The principle of the symbol timing and carrier frequency offset estimation technique is as follows. The A/D converter and sorter 28 (FIG. 1) produces a stream of (I,Q) samples corresponding to each successive symbol. These (I,Q) samples may be filtered using the square root raised cosine filter 29 that is matched to the transmit filter. Symbol timing is established by finding the sample which minimizes the sum of the squared error between the decoded symbol and a corresponding preamble symbol, the sum being accumulated over the entire preamble sequence Alternatively, symbol timing is established by finding the sample which minimizes the sum of the squared error between the phase of a decoded symbol and the phase of a corresponding symbol, the sum being accumulated over the entire preamble sequence. This alternative embodiment is described hereunder. Once this sample is identified, and since the number of samples per symbol is known, the symbol timing may be obtained by use of a simple counter. Similarly, the carrier frequency offset is determined by applying a set of fixed carrier phase correction (rotation) values to each sample and determining which of these values minimizes the symbol decoding error. These two techniques for symbol timing and carrier frequency offset estimation are integrated into a single technique that is illustrated in FIG. 5 and described below. This technique employs the synchronizing word symbols, the preamble 3 of FIG. 1, as a reference to estimate both the optimum sample point and the carrier phase rotation that minimizes the squared error between the reference sequence and the corresponding detected sequence. This technique may also be used to "fine tune" the frame/slot synchronization.

As shown in FIG. 1, each TDMA time slot 2 of data has a unique synchronization word or preamble 3 that is known to the receiver. The TDMA frame of data is acquired by establishing frame and time slot synchronization. This is accomplished with a technique that establishes a coarse frame/slot position that is accurate to within $N_1$ samples of the correct position, where $N_1 < N_s/2$ and $N_s$ is the number of samples per symbol. Having established frame/slot synchronization, $N_2$ ($N_2 > N_1$) data samples on either side of the established slot sync position are buffered. Each buffered sample is then sequentially used as a starting point, in the Equation given below, for locating the optimum sampling instant and carrier phase rotation This technique can be considered as a two-dimensional search procedure that seeks to minimize an objective function with respect to symbol timing and carrier frequency offset. The objective function is defined to be the squared distance between the phase angles of the synchronizing word and the corresponding phase angles obtained in the system of FIG. 5 at the DFE equalizer or decoder 40 output. This process can be mathematically expressed as:

$$\min_{\{j, \Delta\theta\}} \sum_{i=1}^{N_p} (\theta_i + \Delta\theta - \theta_i^c(j))^2 \qquad (28)$$

where,
  j is the sampling instant
  $\theta_i$ is the phase angle of the $i^{th}$ symbol of the preamble
  $\Delta\theta$ is the phase rotation given to the received signal
  $\theta_i^c(j)$ is the decoded phase angle corresponding to the $i^{th}$ symbol at the jth sampling instant, and $N_p$ is the number of symbols in the preamble.

The technique described by Equation 28 obtains an estimate of the phase rotation per symbol. The phase rotation per sample is obtained by dividing $\Delta\theta$ by $N_s$. Either absolute phase angles of symbols or differential phase angles between successive symbols may be used in Equation (28). Using differential phase angles the summation in Equation (28) goes from i=2 to $N_P$.

The technique embodied in Equation 28 is performed by functional block 41 which receives as its input signal the output signal $\theta_i^c$ (j) from DFE 40 of the circuitry depicted in block diagram form in FIG. 5. Because the carrier frequency offset may be expected to remain relatively constant over several hundred TDMA frames 1 (FIG. 1), the process described by Equation 28 may be modified as follows. First, the two-dimensional search for the optimum sample timing (j) and phase rotation ($\Delta\theta$) at start up or at hand-off is performed at functional block 43 on the output signal of functional block 41. The method subsequently compensates for the phase rotation and thereafter searches for only the optimum sampling instant (j), as indicated at functional block 45, at the start of each time slot 2 (FIG. 1).

An implementation of the L-DFE 40 was tested using a simulated mobile radio channel. To evaluate the BER performance, a sample size of $10^{k+2}$ was used to estimate an error probability (Pe) of $10^{-k}$, with a 99% confidence interval of [1.29P, 0.77 $P_e$]. The simulations were conducted at baseband, and perfect frame, slot and symbol synchronization was assumed. The simulated channel used a two ray model and a carrier frequency of 900 MHz. Perfect carrier frequency was assumed at the receiver. A Nyquist square root raised cosine filter 29, matched to the transmit filter (pulse shaper 22 of FIG. 2) was used at the receiver.

A 13-symbol preamble at the beginning of time slot 2 (FIG. 1) was employed to train the L-DFE 40 (FIGS. 3 and 5). The coefficients of L-DFE 40 were then continuously updated during the 6.67 millisecond period of the time slot. In practice, the coded digital verification color code (DVCC) 4 symbols (FIG. 1) may also be used to retrain the L-DFE approximately half way through the time slot. The L-DFE was initially configured with $N_1 = 11$ and $N_2 = 4$, in order to accommodate for wide fluctuations in delay spread. A BER threshold of 3% was assumed. The L-DFE simulations were all performed in single precision arithmetic, with 8-bit input data.

The L-DFE was observed to be substantially insensitive to changes in delay spread. Furthermore, when detected symbols were fed back there was observed an approximately 1 dB degradation in SNR at a BER of 1%. As vehicle speed was increased from 20 to 50 miles per hour, performance was degraded. The performance of the L-DFE was found to be superior to that of a (4, 3) fractionally spaced DFE using a Complex Fast Kalman adaptation algorithm for a delay spread of less than one symbol. This increase in performance is believed to be due to the filter order recursion performed by the adaptation technique as described in Equations 25, 26 and 27. The L-DFE 40 was found to be relatively insensitive to roundoff errors and readily implementable with finite precision arithmetic.

Although the invention has been described in the context of an equalizer for use with the TDMA digital cellular radio signal standard proposed for use in the United States, it can also be applied to other narrowband TDMA or frequency division multiple access (FDMA) mobile radio systems.

While the invention has been particularly shown and described with respect to a preferred embodiment thereof, it will be understood by those skilled in the art that changes in form and details may be made therein without departing from the scope and spirit of the invention.

What is claimed is:

1. Apparatus for demodulating a Time Division Multiple Access (TDMA) signal having a time slot comprised of a plurality of symbols including at least one sequence of synchronizing symbols and a plurality of data symbols, comprising:

receiver means for receiving the signal over a channel;

adaptive filter means for adaptively filtering the received signal to minimize inter-symbol interference due to channel multipath propagation, the adaptive filtering means having a first input coupled to an output of the receiving means and comprising multi-stage lattice decision feedback equalizer means having $(M = N_1 - N_2)$ scalar stages followed by $(N_2 - 1)$ two-dimensional stages, said adaptive filter means including metric forming means coupled to an output of each of said stages for forming a metric in accordance with a predetermined mathematical relationship between respective stage output signal and another stage output signal, said metric forming means including accumulating means for accumulating a plurality of the formed metrics over a plurality of time slots; and recursive means having an input coupled to outputs of said accumulating means for recursively determining a number of stages for the lattice decision feedback equalizer means for use following said time slot, the recursive means including comparison means for comparing the difference between output signals at two outputs of said accumulating means outputs to a threshold value.

2. Apparatus as set forth in claim 1 wherein the metric forming means includes means for forming the metric in accordance with the square of the difference between the output signals of two consecutive stages.

3. Apparatus as set forth in claim 1 wherein the threshold value is a function of received signal delay spread.

4. Apparatus as set forth in claim 1 and further comprising training means for providing the adaptive filter means, at the beginning of a time slot, with a sequence of synchronizing symbols for training the adaptive filter means.

5. Apparatus as set forth in claim 4 wherein the training means also provides the adaptive filter means, at a time subsequent to the beginning of a time slot, with another sequence of synchronizing symbols for retraining the adaptive filter means.

6. Apparatus as set forth in claim 4 wherein the training means also provides the adaptive filter means, at a time subsequent to the beginning of a time slot, with a coded digital verification color code word for retraining the adaptive filter means.

7. Apparatus as set forth in claim 1 wherein the metric forming means forms a metric $J_i$ in accordance with the expression:

$$J_i = \frac{1}{N_{slt}} \sum_{j=1}^{N_{slt}} [\overline{e}_{i+1}(j)^2 - \overline{e}_i(j)^2]$$

where $N_{slt}$ denotes a number of time slots over which the time average is taken, $\overline{e}_i(j)$ denotes an error at stage $i$ averaged over one time slot, and $\overline{e}_{i+1}(j)$ denotes an error at stage $i+1$ averaged over one time slot.

8. Apparatus as set forth in claim 7 wherein the recursive means includes determining means for determining a number of stages in accordance with the expression:

number of stages $= n - 1$ if $$|J_{n-1} - J_n| < \epsilon_{th}$$

where $\epsilon_{th}$ is the threshold, and $J_n$ and $J_{n-1}$ are metrics corresponding to the $n^{th}$ and $(n-1)^{th}$ stages, respectively.

9. Apparatus as set forth in claim 8 wherein the determining means includes means for examining the error from a plurality of stages and for retaining as many stages as possible without degrading operation of the adaptive filter means.

10. Apparatus as set forth in claim 1 and further comprising means responsive to the received signal for compensating for phase rotation of the received signal in accordance with the expression:

$$\min_{\{j,\Delta\theta\}} \sum_{i=1}^{N_p} (\theta_i + \Delta\theta - \theta_i^e(j))^2$$

where, $j$ is the sampling instant $\theta_i$ is the phase angle of the symbol of the preamble $\Delta\theta$ is the phase rotation given to the received signal $\theta_i^e(j)$ is the decoded phase angle corresponding to the $i^{th}$ symbol at the $j$th sampling instant, and $N_p$ is the number of symbols in the preamble.

11. A method for demodulating a Time Division Multiple Access (TDMA) signal having time slots, each of said time slots comprised of a plurality of symbols including at least one sequence of synchronizing symbols and a plurality of data symbols, said method comprising the steps of:
  receiving the signal over a channel; and
  adaptively filtering the received signal to minimize inter-symbol interference due to multipath propagation, the step of adaptively filtering including the steps of:
    processing the received signal with multistage lattice decision feedback equalizer means having ($M = N_1 - N_2$) scalar stages followed by ($N_2 - 2$) two-dimensional stages;
    forming a metric for each of the stages in accordance with a predetermined mathematical relationship between each respective stage output signal and another stage output signal;
    accumulating a plurality of the formed metrics over a plurality of time slots; and
    recursively determining, in each one of said plurality of time slots, a number of stages for use with the lattice decision feedback equalizer means during the next time slot by comparing to a threshold value the difference between the values of two accumulated metrics.

12. The method set forth in claim 11 wherein the step of forming a metric comprises forming the metric in accordance with the square of the difference between a stage error signal and the error signal of a consecutive stage.

13. The method set forth in claim 11 wherein the threshold value is a function of received signal delay spread and wherein the step of recursively determining includes the step of determining the received signal delay spread.

14. The method set forth in claim 11 and further comprising the step of, at the beginning of a time slot, providing a sequence of synchronizing symbols for training the lattice decision feedback equalizer means.

15. The method set forth in claim 11 and further comprising the step of, at the beginning of a time slot, providing a coded digital verification color code word for training the lattice decision feedback equalizer means.

16. The method set forth in claim 14 and further comprising the step of, at a time subsequent to the beginning of said time slot, providing another sequence of synchronizing symbols for retraining the lattice decision feedback equalizer means.

17. The method set forth in claim 11 wherein the step of forming a metric comprises forming a metric $J_i$ in accordance with the expression:

$$J_i = \frac{1}{N_{slt}} \sum_{j=1}^{N_{slt}} [\bar{e}_{i+1}(j)^2 - \bar{e}_i(j)^2]$$

where $N_{slt}$ denotes a number of time slots over which the time average is taken, $\bar{e}_i(j)$ denotes error at stage i averaged over one time slot, and $\bar{e}_{i+1}(j)$ denotes error at stage $i+1$ averaged over one time slot.

18. The method set forth in claim 11 wherein the step of recursively determining is performed in accordance with the expression:

number of stages $= n - 1$ if $$|J_{n-1} - J_n| < \epsilon_{th}$$

where $\epsilon_{th}$ is the threshold value, and $J_n$ and $J_{n-1}$ are metrics corresponding to the $n^{th}$ and $(n-1)^{th}$ stages, respectively.

19. The method set forth in claim 18 wherein the step of recursively determining includes the step of examining a plurality of stages and retaining as many of the stages as possible without degrading performance of the adaptively filtering step.

20. The method set forth in claim 12 and further comprising the step of compensating for phase rotation of the received signal in accordance with the expression:

$$\min_{\{j,\Delta\theta\}} \sum_{i=1}^{N_p} (\theta_i + \Delta\theta - \theta_i^c(j))^2 \qquad (28)$$

where,
  j is the sampling instant
  $\theta_i$ is the phase angle of the symbol of the preamble
  $\Delta\theta$ is the phase rotation given to the received signal
  $\theta_i^c(j)$ is the decoded phase angle corresponding to the ith symbol at the jth sampling instant, and $N_P$ is the number of symbols in the preamble.

* * * * *